(12) United States Patent
Nakamura

(10) Patent No.: US 7,253,460 B2
(45) Date of Patent: Aug. 7, 2007

(54) ACTIVE MATRIX PANEL WITH TWO THIN FILM TRANSISTORS TO A PIXEL

(75) Inventor: Yayoi Nakamura, Hino (JP)

(73) Assignee: Casio Computer Co., Ltd., Tokyo (JP)

( * ) Notice: Subject to any disclaimer, the term of this patent is extended or adjusted under 35 U.S.C. 154(b) by 372 days.

(21) Appl. No.: 11/049,147

(22) Filed: Feb. 2, 2005

(65) Prior Publication Data

US 2005/0167662 A1    Aug. 4, 2005

(30) Foreign Application Priority Data

Feb. 4, 2004    (JP)    .............................. 2004-027801

(51) Int. Cl.
H01L 31/00    (2006.01)
(52) U.S. Cl. .................................... 257/288
(58) Field of Classification Search ................ 257/288
See application file for complete search history.

(56) References Cited

U.S. PATENT DOCUMENTS 5,367,392 A * 11/1994 Janai ........................... 349/55
5,608,557 A    3/1997 Wu
6,259,117 B1 * 7/2001 Takemura et al. ............ 257/59
6,297,518 B1 * 10/2001 Zhang .......................... 257/59
2001/0043292 A1 * 11/2001 Tsujimura et al. ............ 349/43

FOREIGN PATENT DOCUMENTS

| CN | 1138181 A | 12/1996 |
|---|---|---|
| CN | 1338658 A | 3/2002 |
| JP | 58-171860 A | 10/1983 |
| JP | 8-236780 A | 9/1996 |

* cited by examiner

Primary Examiner—Roy Potter
(74) Attorney, Agent, or Firm—Frishauf, Holtz, Goodman & Chick, P.C.

(57) ABSTRACT

An active matrix panel comprises a semiconductor thin film to constitute the switching element which includes••a common source-drain region having a bend portion with a channel region on one end and the other end further followed by a second source region of the channel region sequentially formed to one end of the common source-drain region and a second drain region of the channel region sequentially formed to the other end of the common source-drain which is connected to one of the data lines; a gate insulating film arranged on a surface of the semiconductor thin film; and a gate electrode arranged in areas on the gate insulating film corresponding to the channel region upper part for the second source region and the second drain region which is connected to one of the scanning lines.

19 Claims, 16 Drawing Sheets

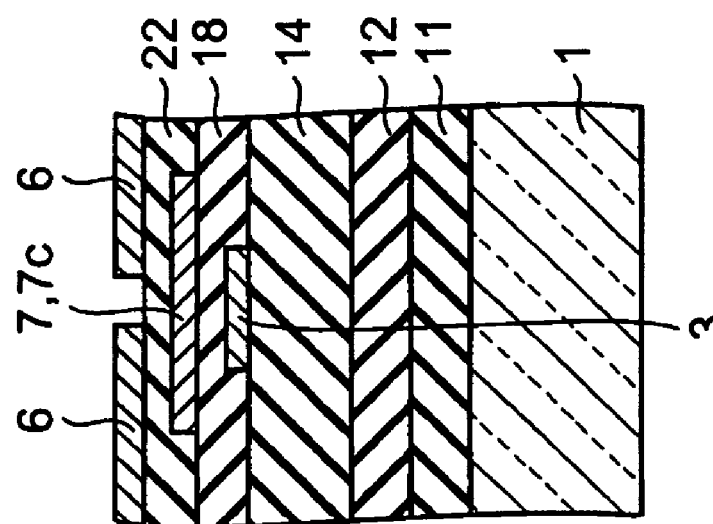
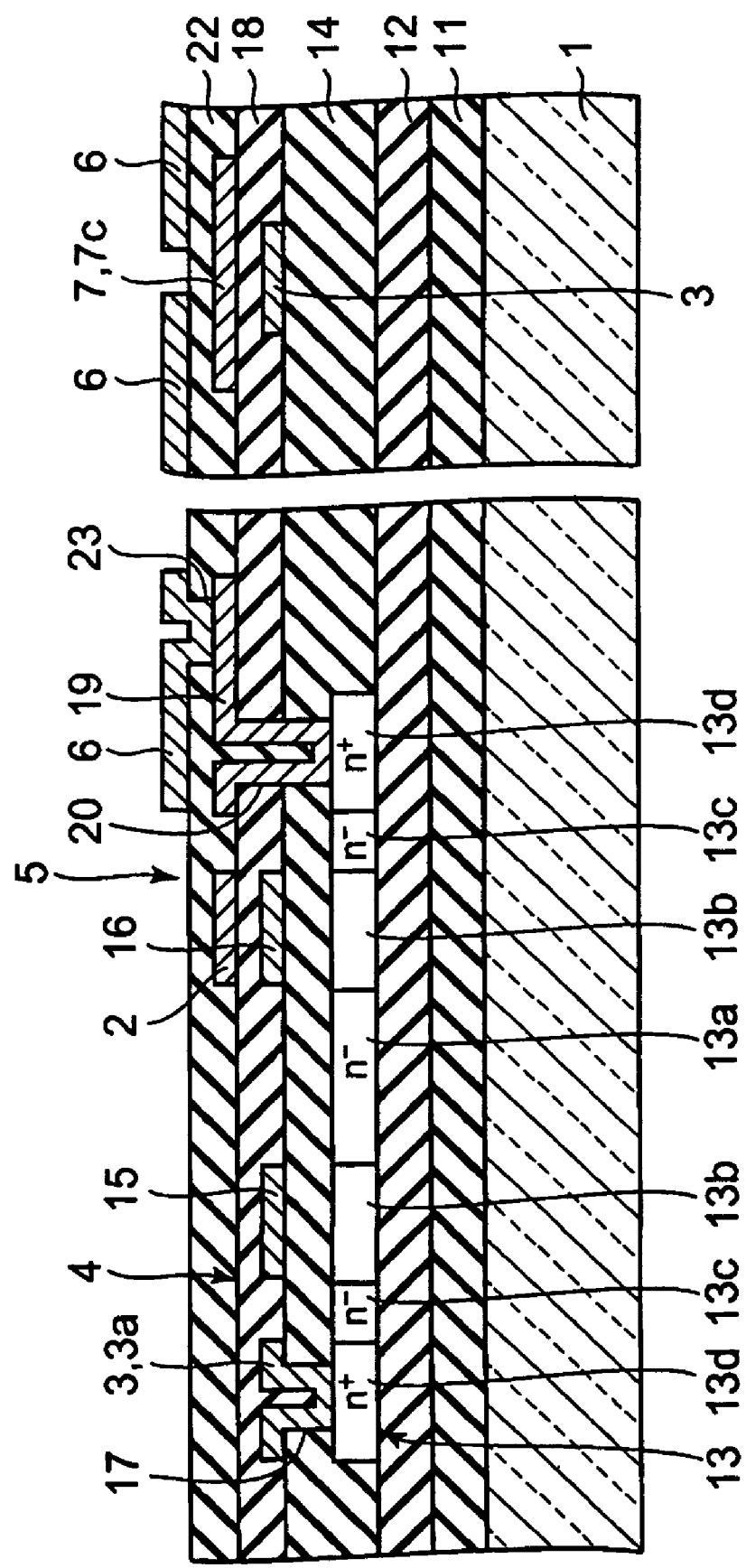
FIG. 2A
FIG. 2B

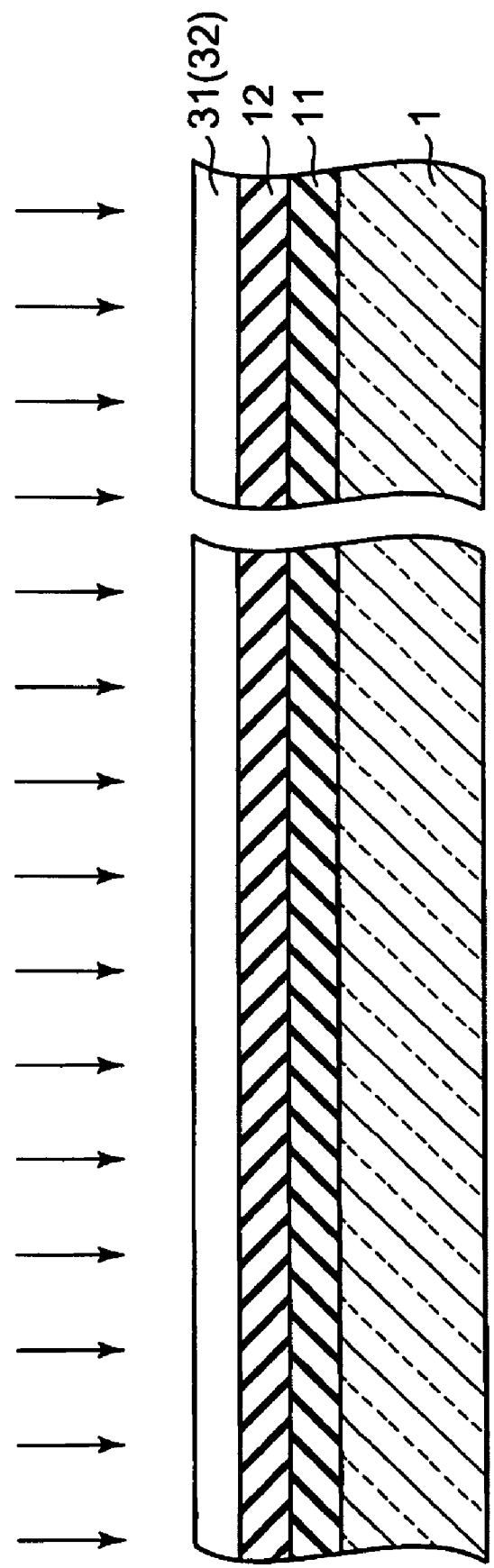

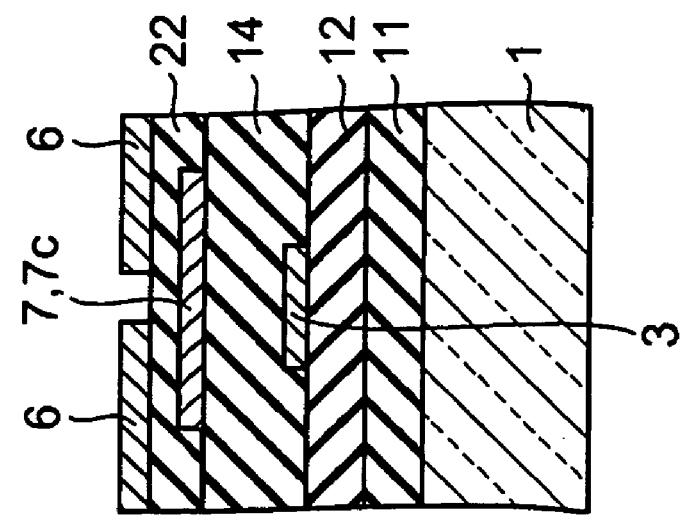
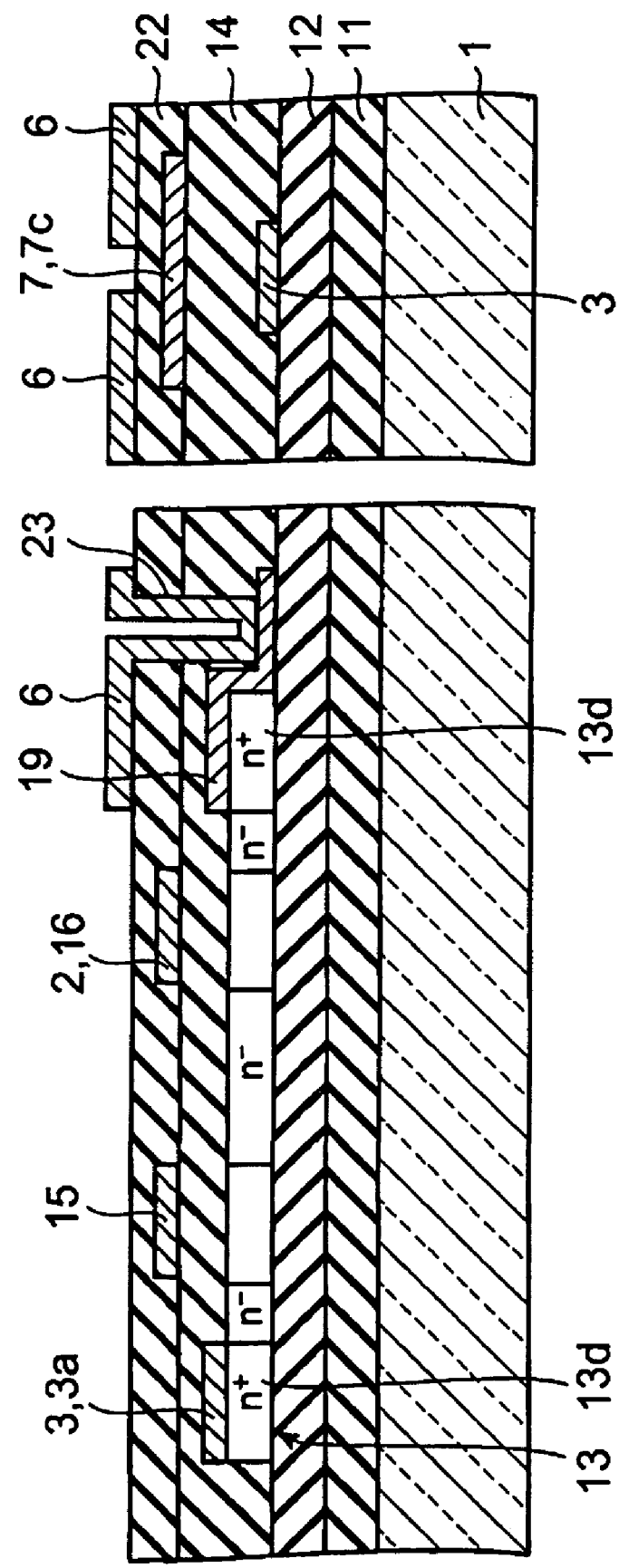

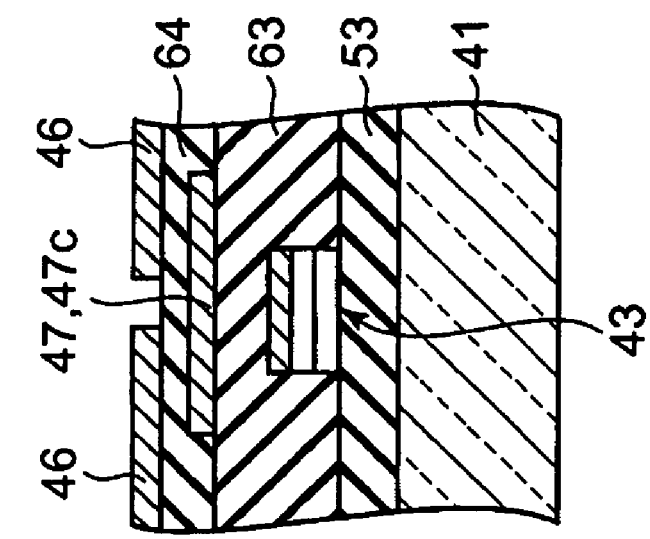
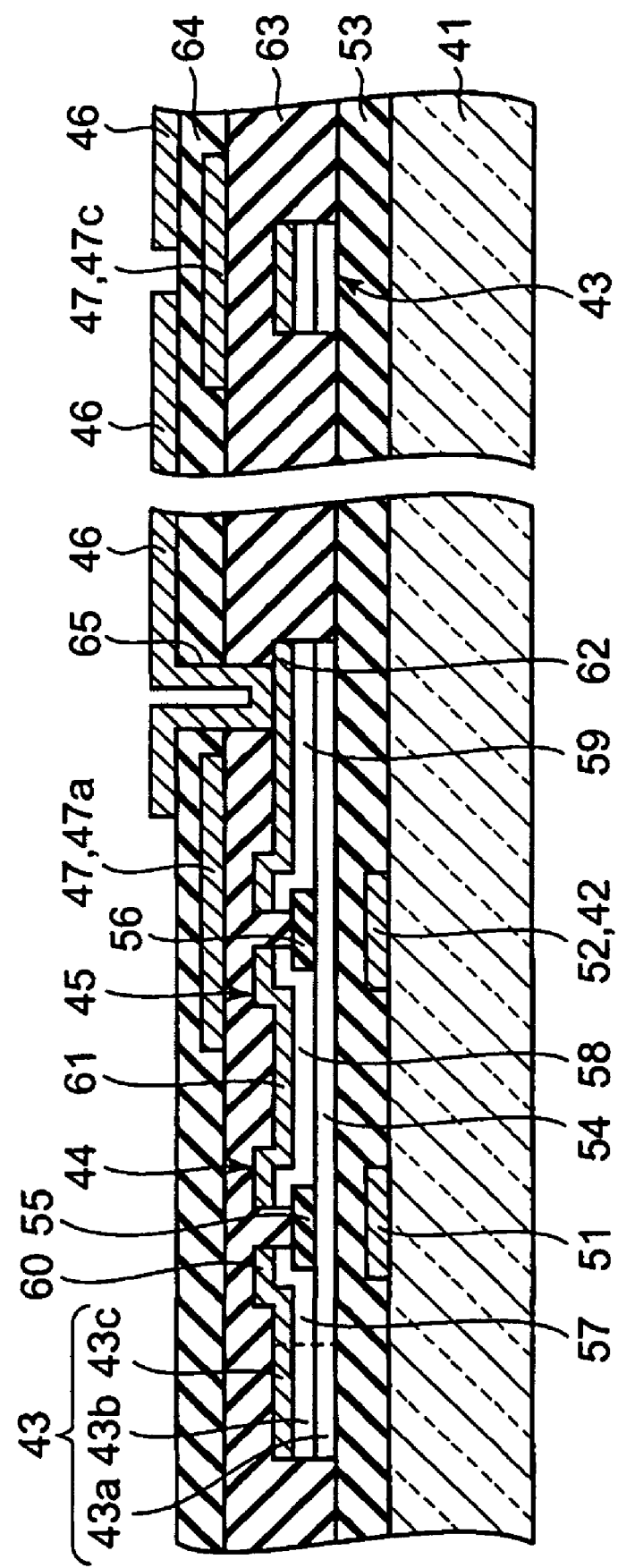

ACTIVE MATRIX PANEL WITH TWO THIN FILM TRANSISTORS TO A PIXEL

CROSS-REFERENCE TO RELATED APPLICATION

This application is based upon and claims the benefit of priority from the prior Japanese Patent Application No. 2004-027801, filed Feb. 4, 2004, the entire contents of which is incorporated herein by reference.

BACKGROUND OF THE INVENTION

1. Field of the Invention

The present invention relates to an active matrix panel, and more particularly to an active matrix panel which has two thin film transistors in each pixel.

2. Description of the Related Art

An active matrix panel in a liquid crystal display is formed with thin film transistors connected to both lines near each intersection of the scanning lines and data lines arranged in a matrix form as well as connected to the pixel (short for "picture element") electrodes of each thin film transistor. In such an active matrix panel, in order to substantially decrease the current flow in an "OFF" state without reducing the current flow in an "ON" state of the thin film transistors, there are some configured with two thin film transistors horizontally connected in series near each intersection point of the scanning lines and data lines arranged in matrix form, for example, as disclosed in Japanese Laid-Open Patent Application (Kokai) No. JP S58-171860 A (Showa 58-1983) titled "THIN FILM TRANSISTOR" (FIG. 6(a)).

Incidentally, in the above-stated conventional prior art active matrix panel example, since two thin film transistors are formed in a series connection simply in the horizontal direction only near each intersection point of the scanning lines and data lines arranged in matrix form, the amount of horizontal layout space occupied by the two side-by-side thin film transistors becomes larger. As a result, this becomes an obstacle when the pixel pitch (pixel spacing) is reduced or the pixel matrix open area ratio becomes narrower.

Consequently, the primary object of the present invention is to provide an active matrix panel which reduces the layout space occupied in the horizontal direction of the above-stated two thin film transistor configuration.

The present invention has been developed to achieve the above object by furnishing a plurality of scanning lines; a plurality of data lines; and a plurality of switching elements which are individually connected to the scanning lines and the data lines; the switching elements respectively comprising a semiconductor thin film which includes a common source-drain region having a bend portion with a channel region on one end and the other end further followed by a second source region of the channel region sequentially formed to one end of the common source-drain region and a second drain region of the channel region sequentially formed to the other end of the common source-drain which is connected to one of the data lines;••a gate insulating film arranged on a surface of the semiconductor thin film; and a gate electrode arranged in areas on the gate insulating film corresponding to the channel region upper part for the second source region and the second drain region which is connected to one of the scanning lines.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIGS. 2A and 2B are cross sectional plan view diagrams which respectively follow the IIA-IIA line and IIB-IIB line in FIG. 1;

FIG. 4 is a cross sectional plan view diagram of the initial process associated with manufacturing of the active matrix panel shown in FIGS. 1, 2A and 2B;

FIGS. 10A and 10B are cross sectional plan view diagrams which respectively follow the XA-XA line and XB-XB line of FIG. 9;

FIGS. 12A and 12B are cross sectional plan view diagrams which respectively follow the XIIA-XIIA line and XIIB-XIIB line of FIG. 11;

DETAILED DESCRIPTION OF THE PREFERRED EMBODIMENTS

The preferred embodiments of the present invention will hereinafter be described in detail with reference to the drawings.

First Embodiment

Figure 1:
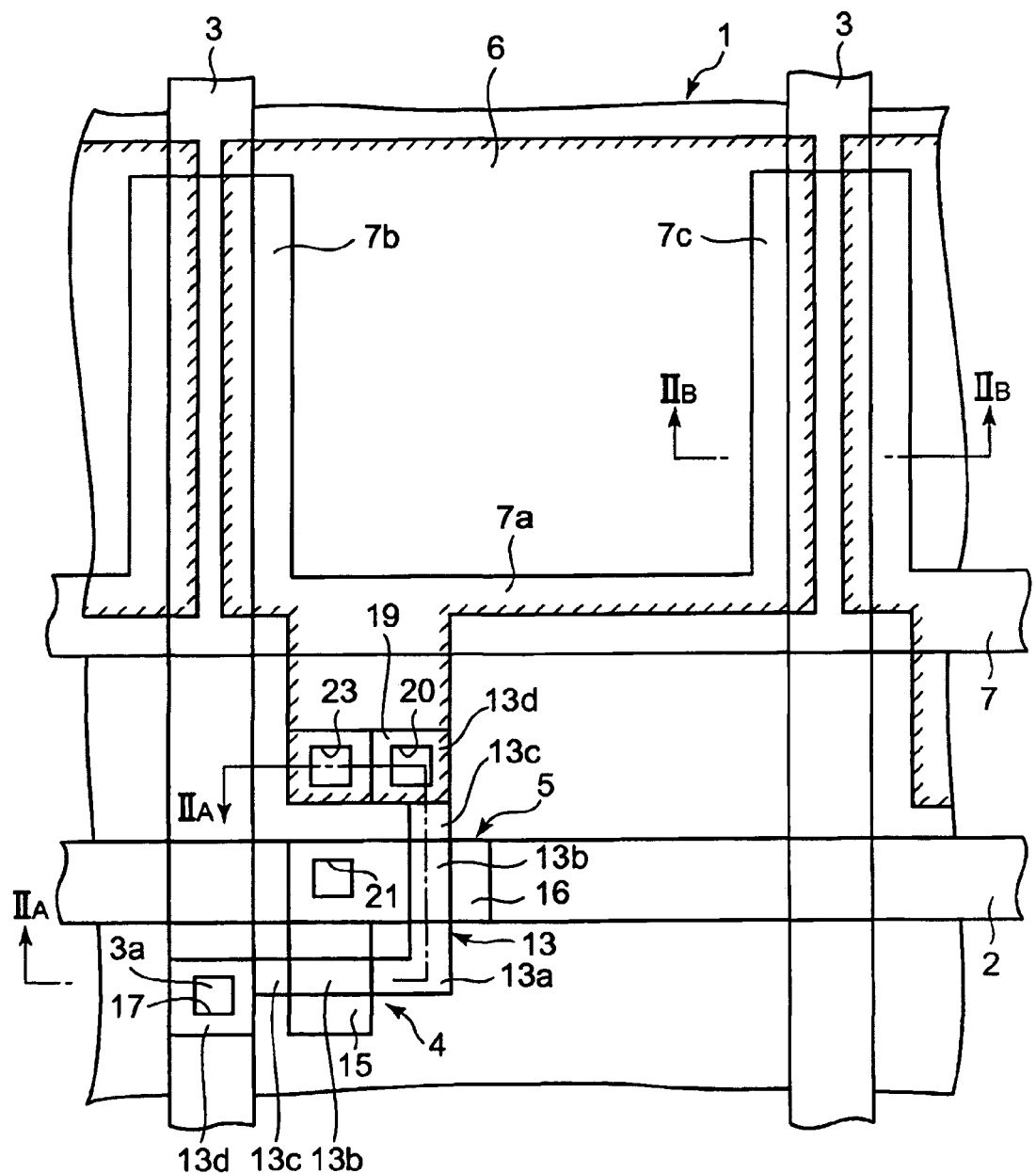
FIG. 1 is a penetration plan view diagram of the main active matrix panel in the liquid crystal display of the first embodiment related to the present invention.

FIG. 1 is a penetration plan view diagram of the main active matrix panel in the liquid crystal display of the first embodiment related to the present invention. This active matrix panel is comprised with a glass substrate 1. On the upper surface side of the glass substrate 1, scanning lines 2 and data lines 3 are arranged in matrix form and configured with two thin film transistors 4, 5 (switching elements), a pixel electrode 6 and an auxiliary capacitative electrode 7 connected in series near each of the intersection points.

Here, hatching is marked with diagonal short solid lines filled in on the edges of each pixel electrode 6 in order to describe FIG. 1.

The left and right side edges of the pixel electrode 6 overlap with the data lines 3 placed on the left and right sides. As shown in FIG. 1, the auxiliary capacitative electrode 7 comprises a straight line-shaped electrode portion 7a oriented in parallel with the scanning lines 2, a rectangular-shaped electrode portion 7b oriented in parallel with the left-hand side data lines 3 and a rectangular-shaped electrode portion 7c oriented in parallel with the right-hand side data lines 3.

In this case, the upper half section of the electrode portion 7a overlaps with the lower edge portion of the pixel electrode 6. The electrode portion 7b overlaps with the left edge portion of the pixel electrode 6 of the example pixel and the right edge portion of the pixel electrode 6 on the left side adjacent to the example pixel, and further overlaps the data lines 3 which are arranged overlapped on the edge of the above-mentioned pixels between the pixel electrode 6 of the example pixel and the pixel electrode 6 of the pixel on the left-hand side adjacent to the example pixel.

The electrode portion 7c overlaps with the right edge portion of the pixel electrode 6 of the example pixel and the left edge portion of the pixel electrode 6 on the right-hand side adjacent to the example pixel, and further overlaps the data lines 3 which are arranged overlapped on the edge of the above-mentioned pixel electrode 6 of the example pixel and the pixel electrode 6 on the right-hand side adjacent to the example pixel.

Furthermore, although explained in more detail later, the electrode portions 7b, 7c are arranged between the pixel electrode 6 and the data lines 3 spaced in the vertical direction, specifically, in the thickness direction (refer to FIG. 2B). Also, the width (parallel length direction to the scanning lines 2) of the electrode portions 7b, 7c is to some extent wider than the width of the data lines 3. Even though there is a positional gap in the parallel direction to the scanning lines 2 after forming the electrode portions 7b, 7c, the purpose is to reliably shield the data lines 3 to keep the data lines 3 from directly opposing the pixel electrode 6.

Next, the detailed structure of the active matrix panel will be explained. FIG. 2A shows a cross sectional plan view diagram which follows the IIA-IIA line and FIG. 2B shows a cross sectional plan view diagram which follows IIB-IIB line in FIG. 1. A first and second base insulating films 11, 12 are formed on the upper surface of the glass substrate 1. A semiconductor thin film 13, such as polysilicon, etc., is formed in a predetermined part of the upper surface for the second base insulating film 12.

Figure 3A:
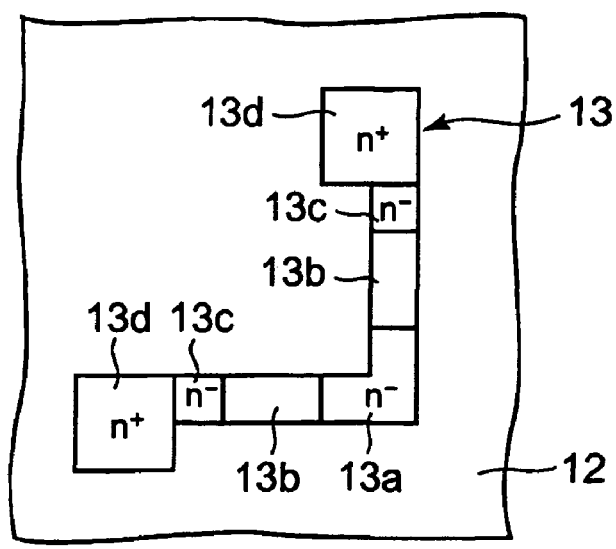
FIGS. 3A~3C are top plan view diagrams which are illustrated in order to explain the sections of the thin film transistors shown in FIG. 1.

Referring to FIG. 3A, the planar shape of the semiconductor thin film 13 is formed in a substantially "L" character shape like a right angle in the central portion. In the neighboring portions which include the bend portion, an N-type impurity low concentration region 13a is created along with a channel region 13b on each side which composes the intrinsic region. The other end sides (both opposite end sides) of each channel region 13b are formed as an N-type impurity low concentration region 13c (dual portions) and likewise the other end sides (subsequent outer end sides) of each N-type impurity low concentration region 13c are formed as an N-type impurity high concentration region 13d (dual portions).

In the above-stated semiconductor thin film 13, one end side of the N-type impurity high concentration region 13d (single portion) is the source-drain regions for a thin film transistor in one direction. The other end side of the N-type impurity high concentration region 13d (single portion) is the source-drain regions for a thin film transistor in the other direction. The N-type impurity low concentration region 13a (single portion) functions as common source-drain regions for two thin film transistors.

Figure 3B:
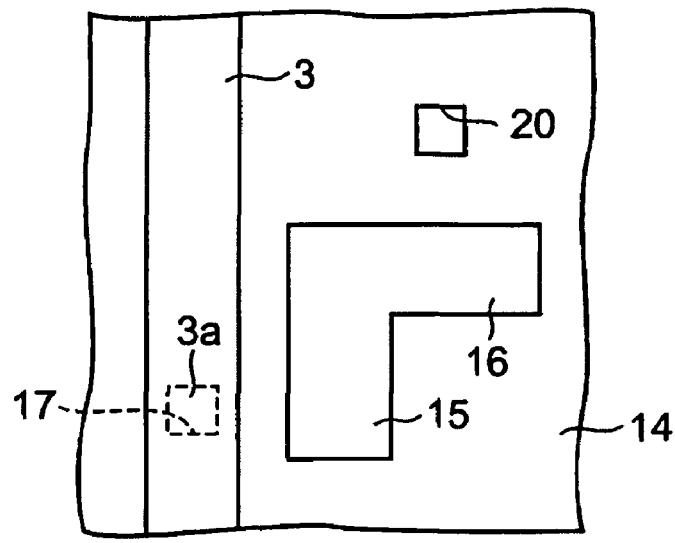

The semiconductor thin film 13 includes a gate insulating film 14 formed on the upper surface of the second base insulating film 12. The gate electrodes 15, 16 are formed on the upper surface of the gate insulating film 14 above the two channel regions 13b in the semiconductor thin film 13. In this case as shown in FIG. 3B, the gate electrodes 15, 16 are created in one piece in an island form and the planar shape is designed in a substantially "L" character shape comparable to a right angle in the central portion. The gate electrode 15 of one side extends out in parallel with the data lines 3 and the gate electrode 16 of the other side extends out in a direction that intersects at a right angle with the side of the gate electrode 15. Here, the expression called "island form" for physically separating other components is applied below by the same definition.

Also as shown in FIG. 3B, the data lines 3 are formed in a predetermined part of the upper surface for the gate insulating film 14. The drain electrode 3a which constitutes a segment of the data lines 3 is connected to one side of the N-type impurity high concentration region 13d in the semiconductor thin film 13 via a contact hole 17 provided in the gate insulating film 14.

Figure 3C:
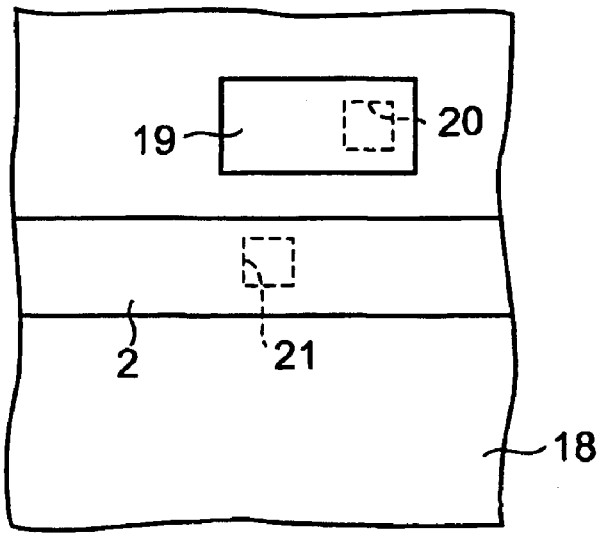

The interlayer insulating film 18 is formed on the upper surface of the gate electrodes 15, 16 in addition to the data lines 3 and the gate insulating film 14. As shown in FIG. 3C, the source electrode 19 is fashioned in an island form in a predetermined part of the upper surface for the interlayer insulating film 18. The source electrode 19 is connected to the other side of the N-type impurity high concentration region 13d in the semiconductor thin film 13 via a contact hole 20 provided in the interlayer insulating film 18 and the gate insulating film 14.

Referring to FIG. 3C, the scanning lines 2 are provided on the upper surface of the interlayer insulating film 18. The scanning lines 2 are connected to the gate electrodes 15, 16 via a contact hole 21 provided in the interlayer insulating film 18. In this case as shown in FIG. 1, the gate electrode 16 is formed in a location which overlaps the scanning lines 2. Besides, the gate electrode 15 extends toward the example pixel electrode 6 in the vertical direction to the applicable scanning lines 2 from the scanning lines 2.

The auxiliary capacitative electrode 7 is formed in the other predetermined part of the upper surface for the interlayer insulating film 18. In this case as shown in FIG. 1, the electrode portions 7b, 7c of the auxiliary capacitative electrode 7 are formed above the interlayer insulating, film 18 and placed above the data lines 3. An overcoat film 22 is formed on the upper surface of the auxiliary capacitative electrode 7, the source electrode 19 and the interlayer insulating film 18. The pixel electrode 6 is formed on the upper surface of the overcoat film 22. The pixel electrode 6 is connected to the source electrode 19 via a contact hole 23 provided in the overcoat film 22.

Here, the thin film transistor 4 contains the gate electrode 15 on one side and the thin film transistor 5 contains the gate electrode 16 on the other side. The N-type impurity low concentration region 13a in the central portion of the semiconductor thin film 13 contains common source-drain regions. In order to function in common, a series connection is made between this N-type impurity low concentration region 13a. Also, the thin film transistors 4, 5 having this series connection are comprised with one drain electrode 3a connected to one N-type impurity high concentration region 13*d* in the semiconductor thin film 13 and one source electrode 19 connected to the other direction of the N-type impurity high concentration region 13*d* in the semiconductor thin film 13.

Furthermore to the above-mentioned, it is assumed that the structure of, the auxiliary capacitative electrode 7 in between the pixel electrode 6 and the data lines 3 is made using a wider width more than the data lines 3. Since this can cause a display tailing phenomenon ("tailing" refers to afterflow) which is generally known as vertical cross talk in which coupling capacitance is formed between both the pixel electrode and the data lines in an overlapped arrangement, the effective remedy for preventing generation of coupling capacitance is accomplished by arranging the auxiliary capacitative electrode with common electric potential (ground potential). Here, since the auxiliary capacitative electrode 7 is wider than the data lines 3, even in the event a gap occurs in the alignment of the auxiliary capacitative electrode 7 and the data lines 3, generation of coupling capacitance from both can be reliably prevented.

Next, an example of the manufacturing method of the active matrix panel of the above-stated configuration will be explained. First, as shown in FIG. 4, the first base insulating film 11 composed of Silicon Nitride (SiN), the second base insulating film 12 composed of Silicon Oxide (SiO$_2$) and an amorphous silicon thin film 31 are consecutively fabricated using a depositing technique known as a plasma Chemical Vapor Deposition (CVD) method on the upper surface of the glass substrate 1. Subsequently, a semiconductor thin film 32 composed of polysilicon is created by transforming the amorphous silicon thin film 31 into polycrystals using a crystallization treatment with a pulsed excimer laser beam.

Figure 5:
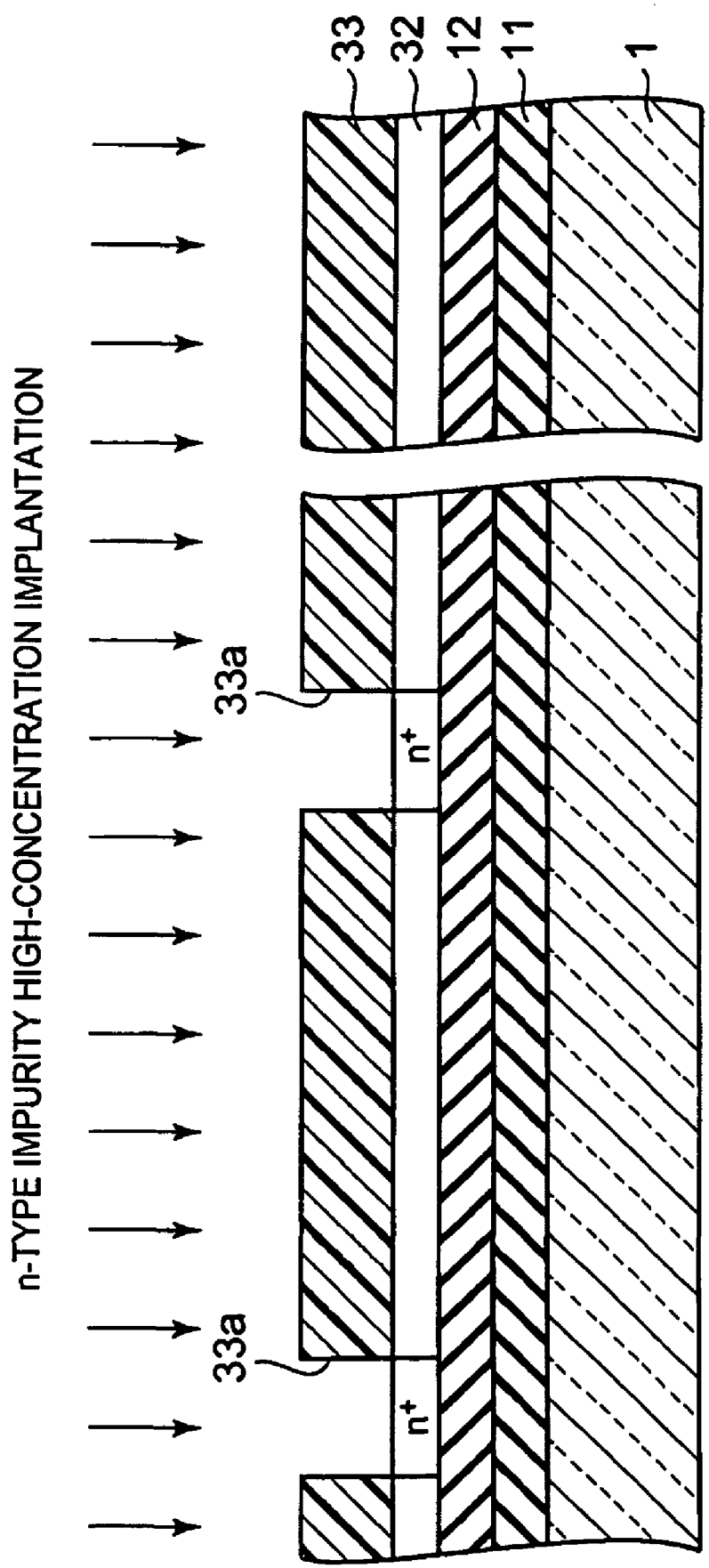
FIG. 5 is a cross sectional plan view diagram of the process following FIG. 4.

Next, as shown in FIG. 5, a photoresist pattern is fabricated which has openings 33 in the portions corresponding to the N-type impurity high concentration region 13*d* formation areas in the semiconductor thin film 13 as shown in FIG. 2 on the upper surface of the semiconductor thin film 32. Afterwards, an N-type impurity dopant of a high concentration is implanted by doping (depositing) the ions onto the semiconductor thin film 32 using a photoresist mask of the photoresist pattern 33. Subsequently, the photoresist pattern 33 is exfoliated (separated).

Figure 6:
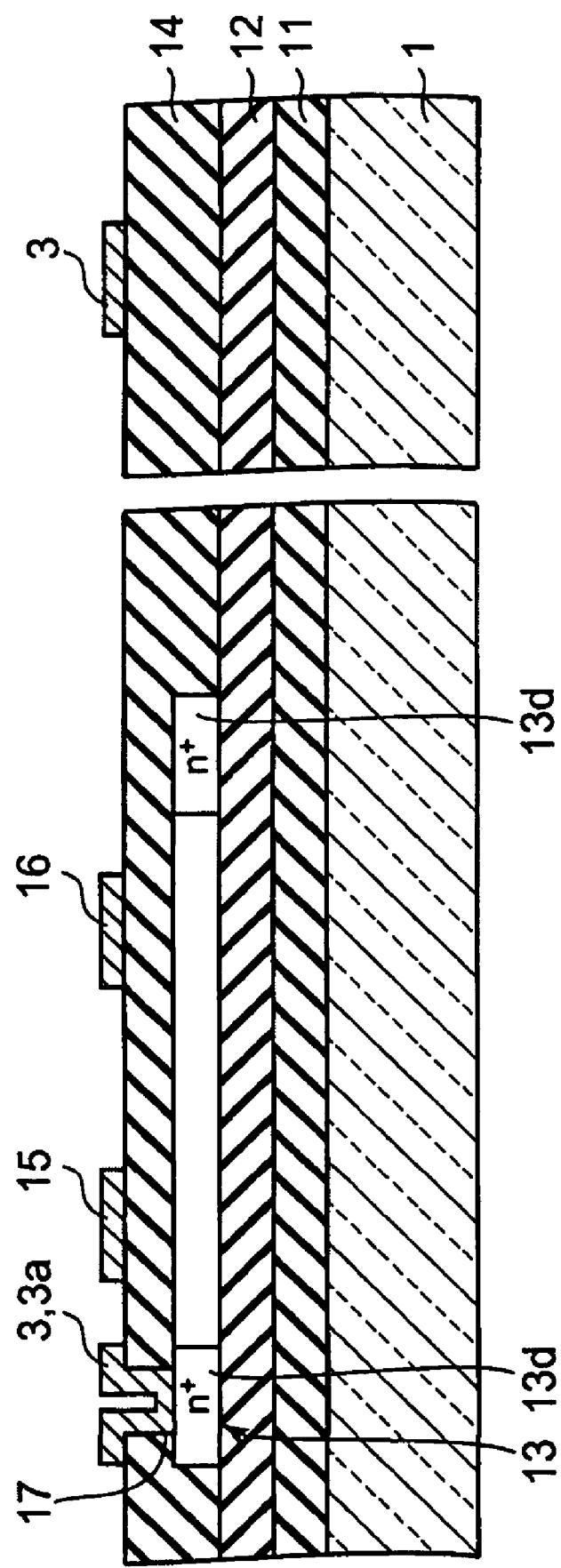
FIG. 6 is a cross sectional plan view diagram of the process following FIG. 5.

Next, as shown in FIG. 6, the semiconductor thin film 13 is formed in a predetermined part of the upper surface of the second base insulating film 12 by patterning. In this state, both ends in the semiconductor thin film 13 constitute the N-type impurity high concentration region 13*d*. Then, the gate insulating film 14 composed of silicon oxide is formed by a plasma CVD method on the upper surface of the second base insulating film 12 including the semiconductor thin film 13. After that, the contact hole 17 is created in the gate insulating film 14 above one of the N-type impurity concentration regions 13*d* in the semiconductor thin film 13.

Next, a metal film composed of aluminum, etc. which serves as the upper surface of the gate insulating film 14 is formed using a sputtering technique and then etched into the predetermined patterned shapes using a photolithographic technique. The gate electrodes 15, 16 are formed in a substantially "L" character shape as shown in FIG. 3B and the data lines 13 are created. In this state, the drain electrode 3*a* which constitutes a segment of the data lines 3 is connected to one side of the N-type impurity high concentration region 13*d* in the semiconductor thin film 13 via the contact hole 17.

Figure 7:
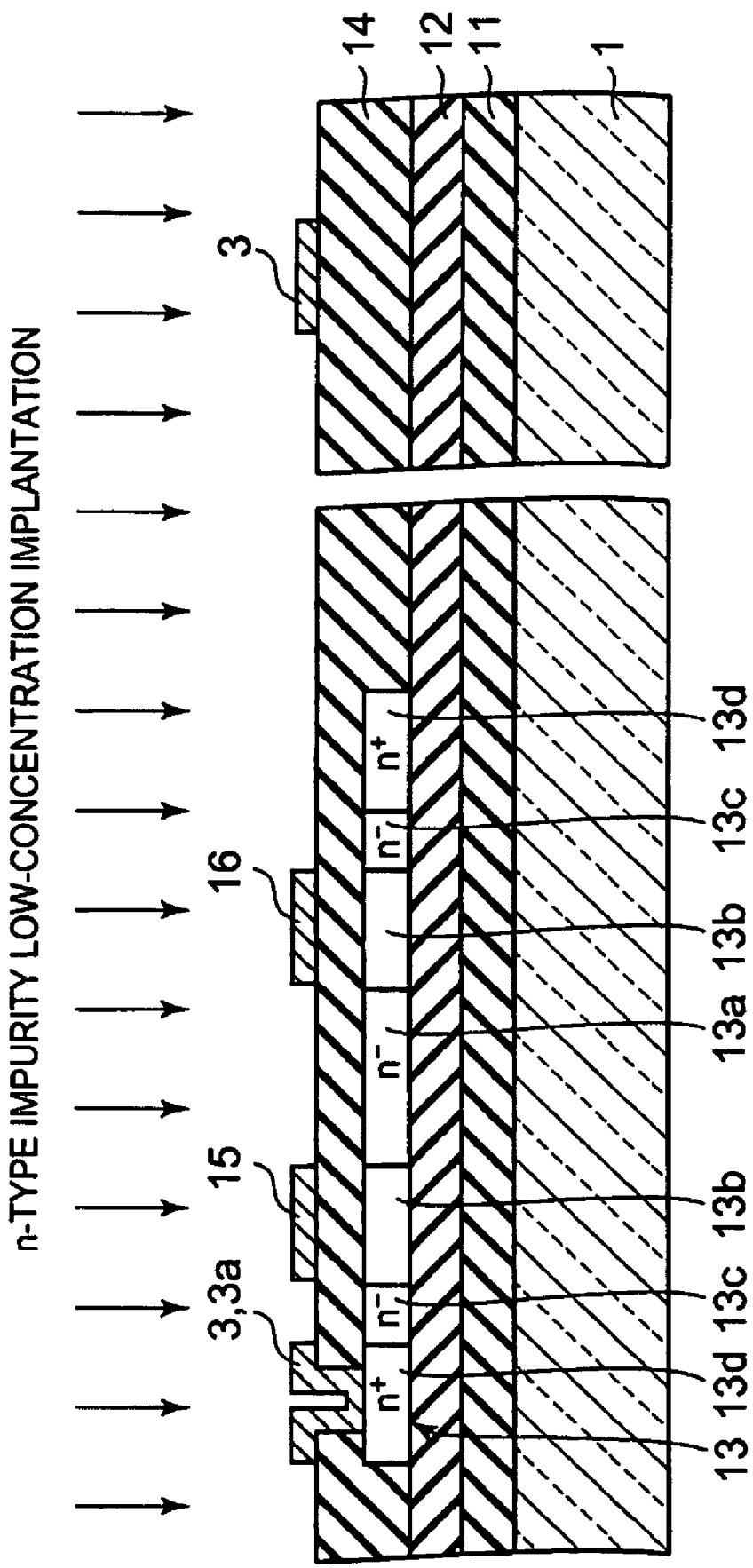
FIG. 7 is a cross sectional plan view diagram of the process following FIG. 6.

Subsequently, as shown in FIG. 7, the gate electrode 15, 16 are implanted by doping an N-type impurity of a low concentration using a photoresist mask. Also, the region between the two gate electrodes 15, 16 of the semiconductor thin film which constitute the N-type impurity low concentration region 13*a*; the regions below the gate electrodes 15, 16 which constitute the channel region 13*b* composing the intrinsic regions; both sides which constitute the N-type impurity low concentration region 13*c*; and both sides which constitute the N-type impurity high concentration region 13*d* are formed. Afterwards, annealing treatment is accomplished for about one hour at a temperature of generally around 500 degrees Celsius (932 degrees Fahrenheit) within a nitrogen gas atmosphere where the implanted impurities become electrically activated.

Figure 8:
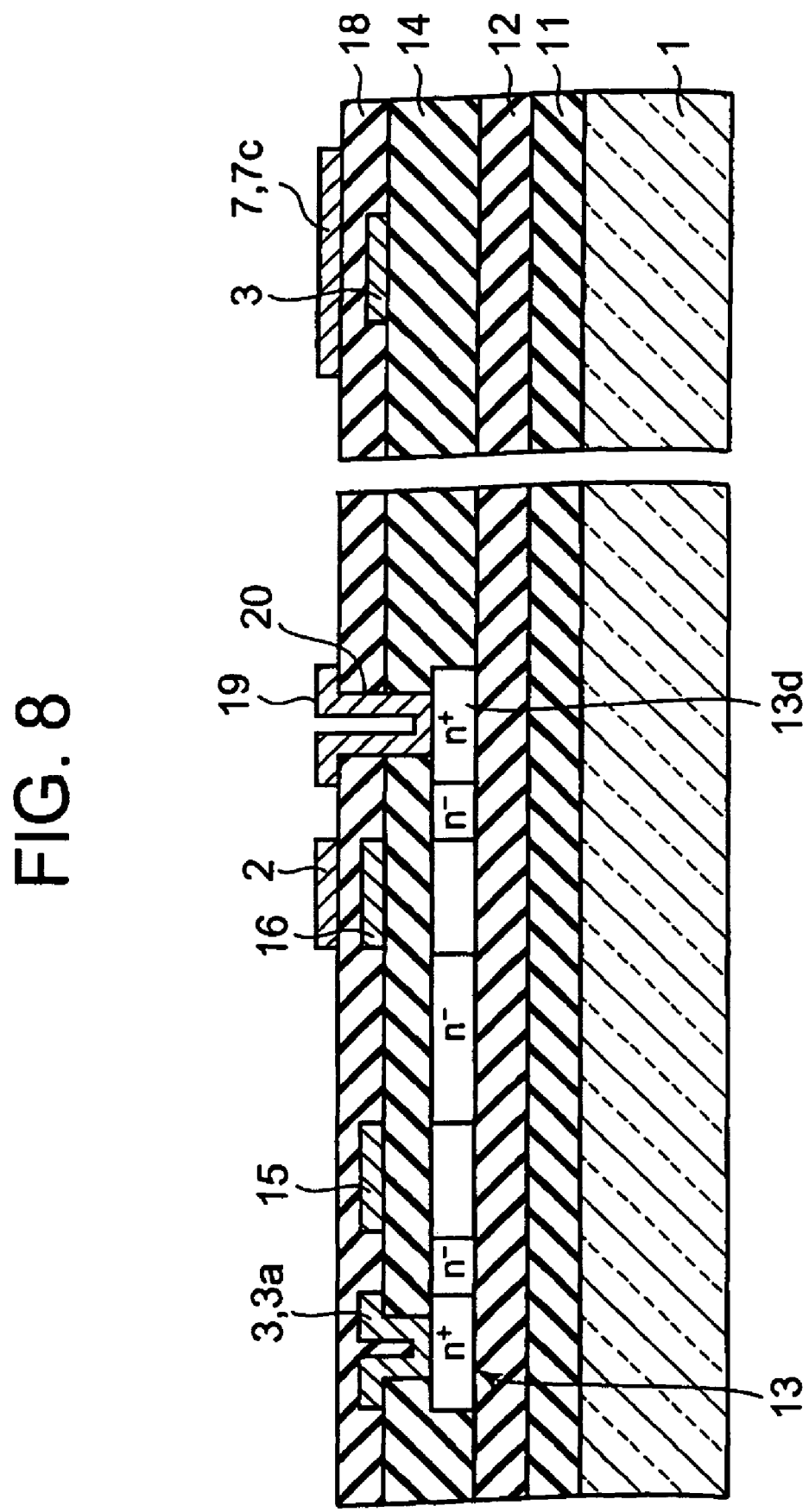
FIG. 8 is a cross sectional plan view diagram of the process following FIG. 7.

Next, as shown in FIG. 8, the interlayer insulating film 18 composed of silicon nitride is formed by a plasma CVD method on the upper surface of the gate electrodes 15, 16, the data lines 3 and the gate insulating film 14. Then, the contact hole 20 is created in the interlayer insulating film 18 above the other N-type impurity high concentration region 13*d* in the semiconductor thin film 13.

Subsequently, film formation follows in the order of Aluminum (Al) film and Chromium (Cr) film (or Molybdenum (Mo) film) for the IndiumTin Oxide (ITO) top contact using a sputtering technique on the upper surface of the interlayer insulating film 18 and then patterning these overlaying alloys of Al film and Cr film (or Mo film). Consequently, the scanning lines 2, the source electrode 19 and the auxiliary capacitative electrode 7 are fabricated. In this state, the source electrode 19 is connected to the N-type impurity high concentration region 13*d* of the other direction in the semiconductor thin film 13 via the contact hole 20.

Then, as shown in FIG. 2, the overcoat film 22 composed of silicon nitride is formed by a plasma CVD method on the upper surface of the source electrode 19 and the interlayer insulating film 18. Next, the contact hole 23 is created in the overcoat film 22 above the source electrode 19. Subsequently, by forming the ITO film using a sputtering technique and patterning this ITO film on the upper surface of the overcoat film 22, the pixel electrode 6 is formed which is connected to the source electrode 19 via the contact hole 23. In this manner, the active matrix panel shown in FIGS. 1 and 2 is obtained.

Accordingly, in the obtained active matrix panel, each of the gate electrodes 15, 16 of the two thin film transistor 4, 5 are installed in a series connection formed with one side of the gate electrode and the other side gate electrode in a substantially "L" character shaped gate electrode configuration. Thus, considering the present invention in comparison with the conventional prior art case where the two side-by-side thin film transistors 4, 5 are formed in a series connection simply in the horizontal direction only, the horizontal layout space occupied by the two thin film transistors 4, 5 can be significantly reduced which makes it feasible to reduce the pixel pitch (pixel spacing) or to enlarge the pixel matrix open area ratio in connection with this.

Besides, in the liquid crystal display provided with the obtained active matrix panel, the electrode portions 7*b*, 7*c* of the auxiliary capacitative electrode 7 are broader than the width of the data lines 3 which are formed between the edge of the pixel electrode 6 and the data lines 3. The present invention configures the electrode portions 7*b*, 7*c* in such a manner so as to reliably prevent generation of coupling capacitance between the edge of the pixel electrode 6 and the data lines 3. Consequently, vertical cross talk can be prevented from occurring and the display properties can be improved.

Second Embodiment

Figure 9:
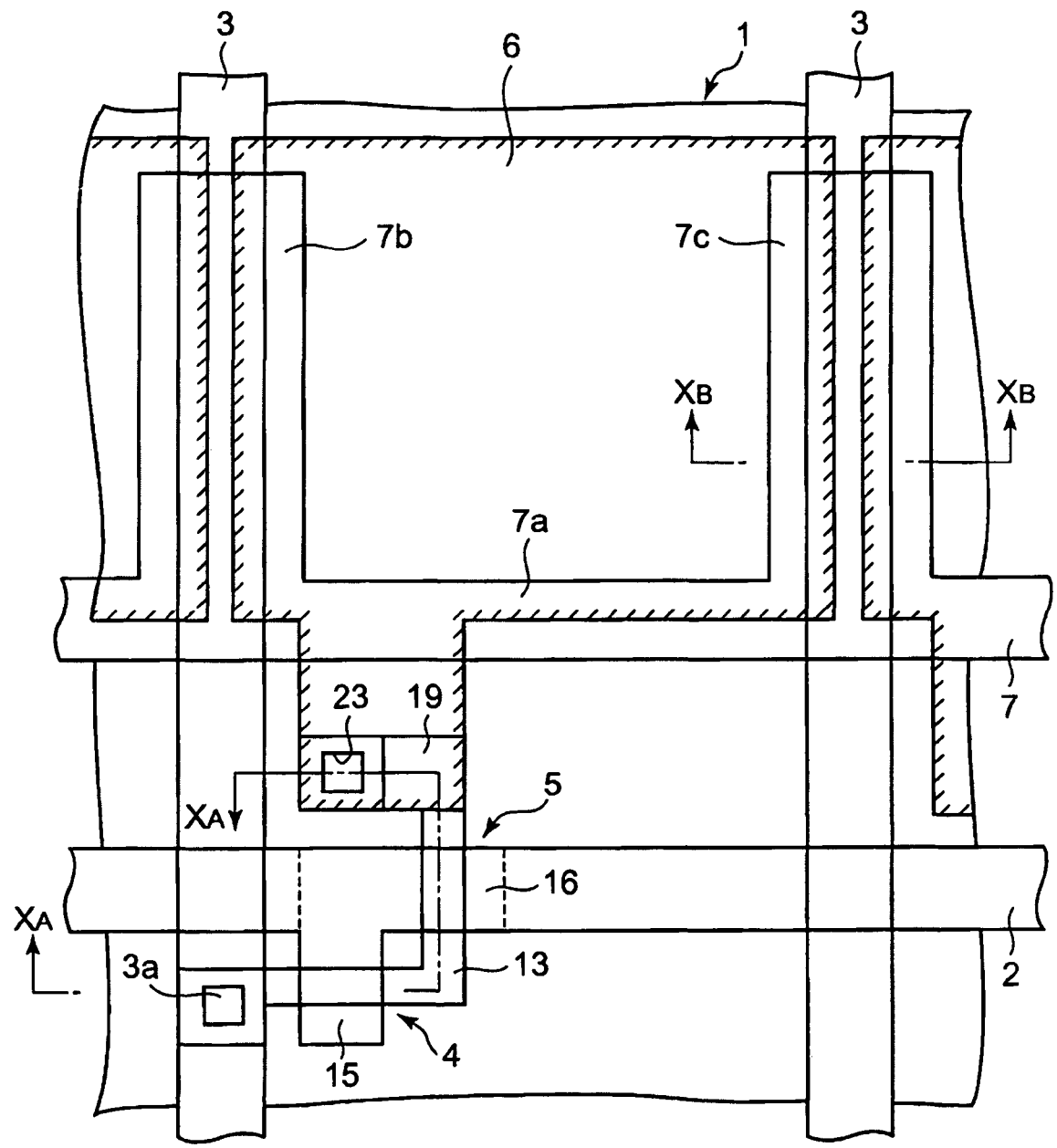
FIG. 9 is a penetration plan view diagram of the main active matrix panel in the liquid crystal display of the second embodiment related to the present invention.

FIG. 9 is a penetration plan view diagram of the main active matrix panel in the liquid crystal display of the second embodiment related to the present invention. FIG. 10A shows a cross sectional plan view diagram which follows the XA-XA line of FIG. 9 and FIG. 10B shows a cross sectional plan view diagram which follows the XB-XB line of FIG. 9. Also, in this case hatching is marked with diagonal short solid lines filled in on the edges of each pixel electrode 6 in order to describe FIG. 9.

Next, the specific differences between this active matrix panel and the first embodiment case illustrated in FIGS. 1 and 2 will be explained. One difference is the interlayer insulating film 18 is omitted. The data lines 3 which function as the drain electrode 3a are formed on the upper surface of the second base insulating film 12 to include the upper surface of one direction of the N-type impurity high concentration region 13d of the semiconductor thin film 13. The source electrode 19 is formed in an island form on the upper surface of the other direction of the N-type impurity high concentration region 13d (single portion) in the semiconductor thin film 13 and on the upper surface of the second base insulating film 12 near the N-type impurity high concentration region 13d. Notably, the pixel electrode 6 formed on the upper surface of the overcoat film 22 is connected to the source electrode 19 via the contact hole 23 formed in the overcoat film 22 and the gate insulating film 14.

Another difference is the scanning lines 2 which function as the gate electrode 16 of the opposite direction are formed in a predetermined part of the upper surface of the gate insulating film 14 and the gate electrode 15 of one direction is formed by a portion which extends vertically from a predetermined part of the scanning lines 2. Consequently, in this case the gate electrodes 15, 16 are composed of a gate electrode for one direction side and the opposite direction side in a vertical-facing inverted L-shape.

Third Embodiment

Although each of the above-stated embodiments explained a case of applying a suitable coplanar type structure for an active matrix panel comprised with semiconductor thin film transistors composed of polysilicon, the present invention is not only applicable to a coplanar type structure but also can be applied to a suitable inverse-staggered type structure for an active matrix panel provided with thin film transistors composed of amorphous silicon.

Figure 11:
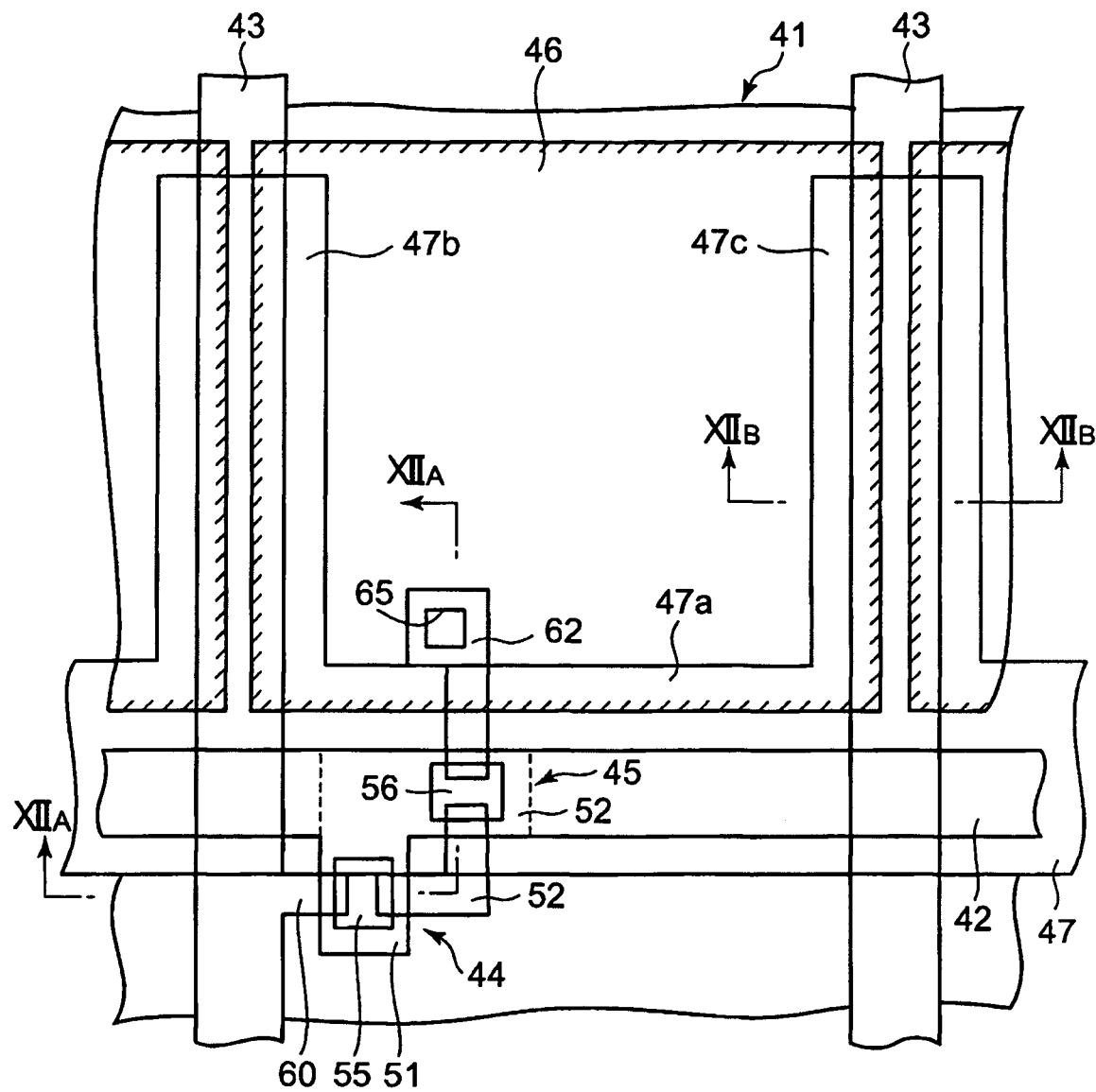
FIG. 11 is a penetration plan view diagram of the main active matrix panel in the liquid crystal display of the third embodiment related to the present invention.

FIG. 11 is a penetration plan view diagram of the main active matrix panel comprised with thin film transistors in an inverse stagger type structure in the liquid crystal display of the third embodiment related to the present invention. This active matrix panel comprises a glass substrate 41. On the upper surface side of the glass substrate 41, scanning lines 42 and data lines 43 are arranged in matrix form and configured with two thin film transistors 44, 45, a pixel electrode 46 and an auxiliary capacitative electrode 47 connected in series near each of the intersection points. Here, hatching is marked with diagonal short solid lines filled in on the edges of each pixel electrode 6 in order to describe FIG. 11.

The left and right side edges of the pixel electrode 46 overlap with one of the data lines 43 placed on the left and right sides. As shown in FIG. 11, an auxiliary capacitative electrode 47 comprises a straight line-shaped electrode portion 47a oriented in parallel with the one of the scanning lines 42, a rectangular-shaped electrode portion 47b oriented parallel with the left-hand side with one of the data lines 43 and a rectangular-shaped electrode portion 47c oriented in parallel with the right-hand side of one of the data lines 43. In this case, the upper half section of the electrode portion 47a overlaps with the lower edge portion of the pixel electrode 46. The electrode portions 47b, 47c overlap with one of the data lines 43 which are arranged in between the edge portions relative to the pixel electrode 46 that are adjacent on the left and right directions.

Additionally, although explained in more detail later, the electrode portions 47b, 47c are arranged between a pixel electrode 46 and one of the data lines 43 spaced in a vertical direction, specifically, in the thickness direction (refer to FIG. 12A) Also, the width (parallel length direction to the scanning lines 42) of the electrode portions 47b, 47c is to some extent wider than the width of one of the data lines 43. Even though there is a positional gap in the parallel direction to the scanning lines 42 after forming the electrode portions 47b, 47c, the purpose is to reliably shield the data lines 43 to keep the data lines 43 from directly opposing the pixel electrode 46.

Next, the detailed structure of this active matrix panel will be explained. FIGS. 12A and 12B are cross sectional plan view diagrams which respectively follow the XIIA-XIIA line and XIIB-XIIB line of FIG. 11. The scanning lines 42 which function as a gate electrode 52 for the opposite direction are provided in a predetermined part of the upper surface of the glass substrate 41 and a gate electrode 51 of one direction extends out at a right angle from a predetermined part of the scanning lines 42. Consequently, in this case the gate electrodes 51, 52 are composed of a gate electrode for one direction side and the opposite direction side in a vertical-facing inverted L-shape.

A gate insulating film 53 is formed on the upper surface of the glass substrate 41 including the gate electrodes 51, 52 and the scanning lines 42. An intrinsic amorphous silicon thin film 54 is formed in a predetermined part on the upper surface of the gate insulating film 53 above the gate electrodes 51, 52. Channel protective films 55, 56 are formed on the upper surface of the intrinsic amorphous silicon thin film 54 above the gate electrodes 51, 52.

Contact layers 57, 58, 59 composed of an N-type amorphous silicon are formed on the upper surface of the intrinsic amorphous silicon thin film 54 in between and on either side of the channel protective films 55, 56. A drain electrode 60, a common source-drain electrode 61 and a source electrode 62 are formed on the upper surface of the contact layers 57, 58, 59.

Here, the thin film transistor 44 has the gate electrode 51 for one direction side and the thin film transistor 45 has the gate electrode 52 for the opposite direction side with the common source-drain electrode 61. Underneath this is the contact layer 58 and below that the common semiconductor thin film 54 is formed. A series connection is provided via this in common portion. Then, these thin film transistors 44, 45 in which a series connection is provided are comprised with one drain electrode 60 and one source electrode 62.

The data lines 43 are formed in the upper surface of the gate insulating film 53. In this case, the data lines 43 have a three-layered structure of a semiconductor thin film 43a, an N-type amorphous silicon layer 43b and a metal layer 43c. In brief, the data lines 43 also have a laminated three-layered structure in which the semiconductor thin film 54 has the identical structure as the thin film transistors 44, 45 which are formed below the drain electrode 60 with the contact layer 57 formed underneath.

An interlayer insulating film 63 is formed on the upper surface of the gate insulating film 53 including the thin film transistors 44, 45 and the data lines 43. The auxiliary capacitative electrode 47 is formed on the upper surface of the interlayer insulating film 63. An overcoat film 64 is formed on the upper surface of the auxiliary capacitative electrode 47 and the interlayer insulating film 63. The pixel electrode 46 is connected to the source electrode 62 via a contact hole 65 provided in the overcoat film 64 and the interlayer insulating film 63.

Figure 13:
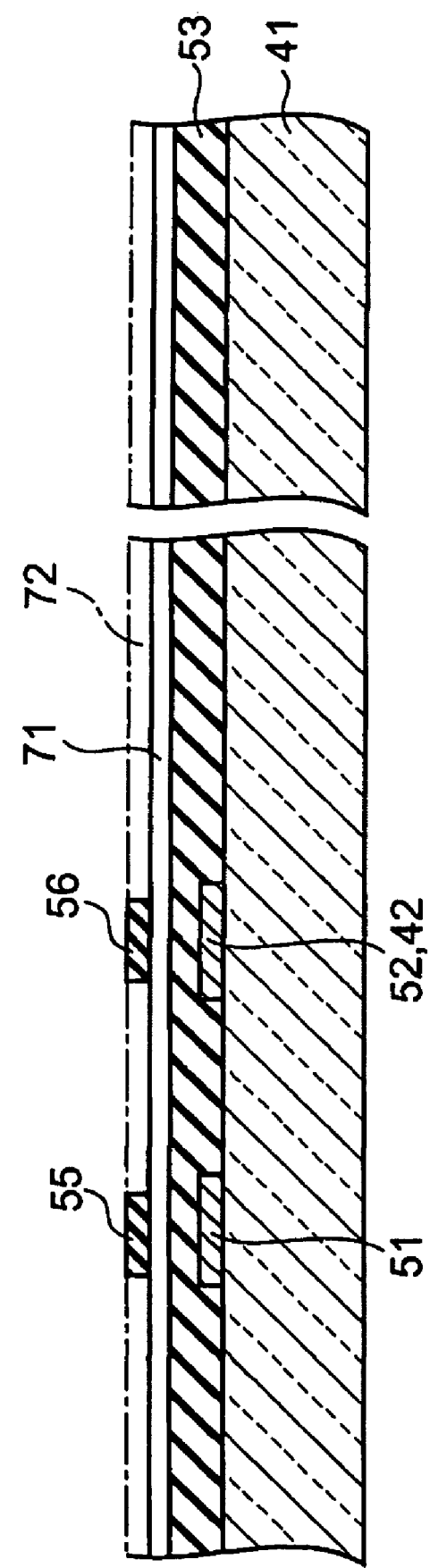
FIG. 13 is a cross sectional plan view diagram of the initial process associated with manufacturing of the active matrix panel shown in FIGS. 11, 12A and 12B.

Next, an example of the manufacturing method of the active matrix panel of the above-stated configuration will be explained. First, as shown in FIG. 13, the scanning lines 42 including the gate electrodes 51, 52 are formed by depositing a metal film composed of Chromium (Cr), etc. using a sputtering technique on the upper surface of the glass substrate 41 and afterwards patterning the metal film.

Subsequently, the gate insulating film 53 composed of silicon nitride using a plasma CVD method, a semiconductor thin film 71 composed of intrinsic amorphous silicon and a silicon nitride layer 72 are consecutively fabricated on the upper surface of the glass substrate 41 including the gate electrodes 51, 52 and the scanning lines 42. The channel protective films 55, 56 are formed by patterning the silicon nitride layer 72.

Figure 14:
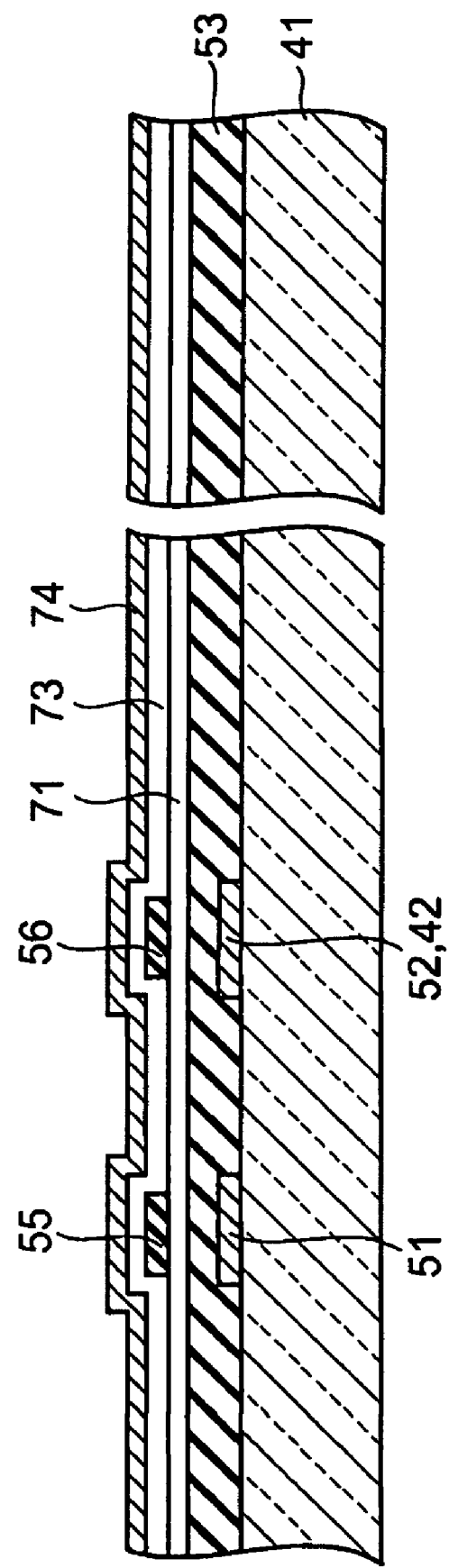
FIG. 14 is a cross sectional plan view diagram of the process following FIG. 13.

Next, as shown in FIG. 14, a semiconductor thin film 73 is implanted with a high-impurity-concentration composed of N-type amorphous silicon by a plasma CVD method on the upper surface of the semiconductor thin film 71 including the channel protective films 55, 56. Then, a metal layer 74 composed of Chromium (Cr), etc. is formed using a sputtering technique on the upper surface of the high-impurity-concentration semiconductor thin film 73.

Figure 15:
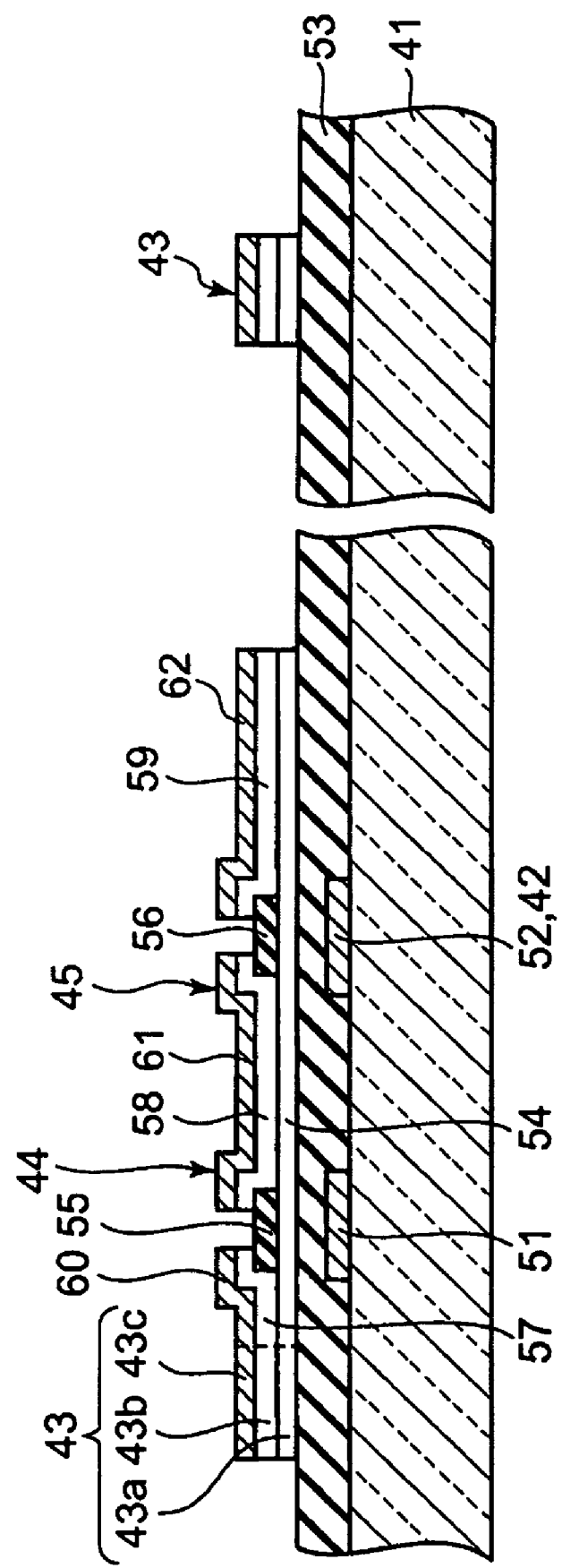
FIG. 15 is a cross sectional plan view diagram of the process following FIG. 14.

Next, by consecutively patterning the metal layer 74, the high-impurity concentration semiconductor thin film 73 and the semiconductor thin film, as shown in FIG. 15, the drain electrode 60, the common source-drain electrode 61, the source electrode 62, the contact layers 57, 58, 59 and the intrinsic semiconductor thin film 54 are formed in the thin film transistor 44, 45 formation areas. Furthermore, at this point, simultaneously the data lines 43 formation areas are created which become the three-layer structure of the data lines 43 consisting of the metal layer 43c, the high-impurity-concentration semiconductor thin film 43b and the intrinsic semiconductor thin film 43a.

Figure 16:
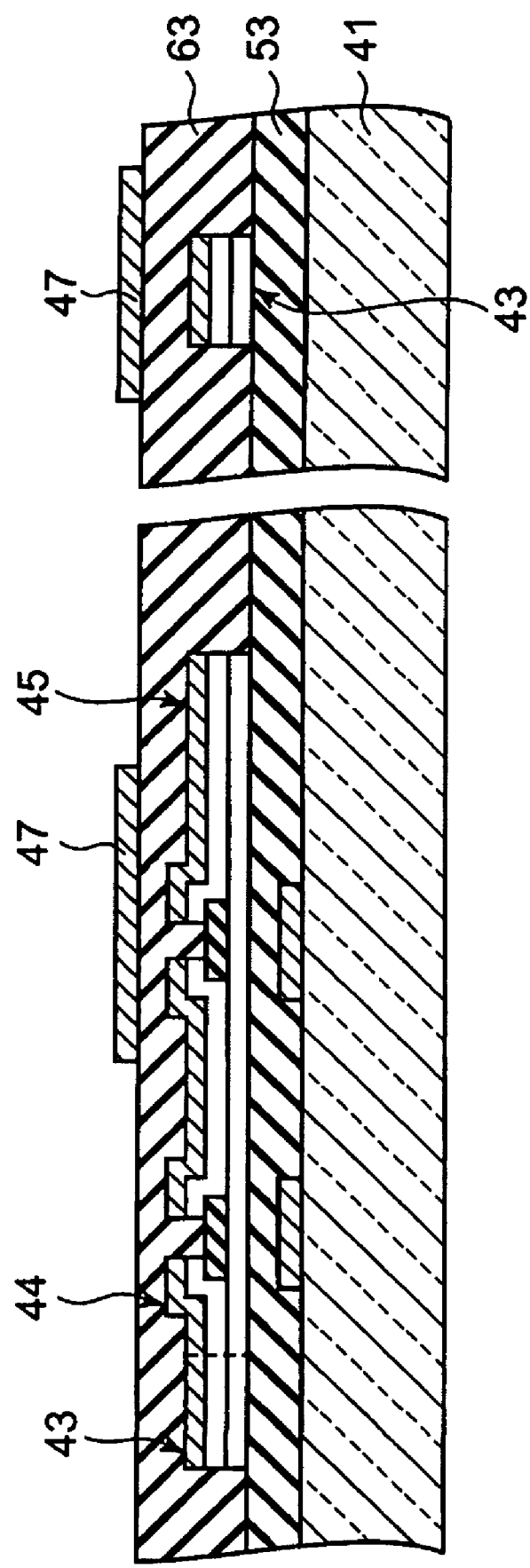
FIG. 16 is a cross sectional plan view diagram of the process following FIG. 15.

Subsequently, as shown in FIG. 16, the interlayer insulating film 63 composed of silicon nitride is formed using a plasma CVD method which becomes the upper surface of the thin film transistors 44, 45, the data lines 43 and the gate insulating film 53. Afterwards, the auxiliary capacitative electrode 47 is formed by depositing a metal film composed of Chromium (Cr), etc. using a sputtering technique in a predetermined part of the upper surface of the interlayer insulating film 63 and then patterning this metal film.

Next, as shown in FIG. 12, the overcoat film 64 composed of silicon nitride is formed using a plasma CVD method on the upper surface of the auxiliary capacitative electrode 47 and the interlayer insulating film 63. Then, the contact hole 65 is created in the overcoat film 64 above the source electrode 62. This is followed by forming an ITO film using a sputtering technique in a predetermined part of the upper surface of the overcoat film 64 and then patterning this ITO film and formed to connect the pixel electrode 46 to the source electrode 62 via the contact hole 65. In this manner, an active matrix panel shown in FIGS. 11 and 12 is acquired.

In addition, although the above-stated embodiment explained an active matrix panel in a case which applies to a liquid crystal display, the present invention is applicable to other display devices, for example, organic electro-luminescent (EL) devices or photosensors. Furthermore, the semiconductor thin film is formed in a substantially "L" character planar shape, although the low-impurity-concentration regions were only formed in neighboring portions including the central portion, a high-impurity-concentration region may be formed in the central portion of the low-impurity-concentration region.

Besides, although the semiconductor thin film has a vertical-facing inverted L-shaped bend portion containing a right angle, the bend portion does not have to be a right angle necessarily. For example, an acute angle, an obtuse angle or a circular shape are also considered to be good options. Further, as described earlier the gate electrodes are formed in a vertical-facing inverted L-shaped which traverse the channel region of each of the semiconductor thin film at a right angle. The bend portion which traverses the channel region of each of the semiconductor thin film at a right angle only has to be connected to the two gate electrodes in the bend portion. Once again, an acute angle, an obtuse angle or a circular shape are also considered to be good options. In addition, if the structure covers the upper part of the two channel regions, it is conceivable to not have a design which has a bend portion by also considering a covering for the entire semiconductor thin film formation area in such as a rectangular shape or other form. Finally, although the thin film transistors have an N-type impurity region, thin film transistors having a P-type impurity region are also applicable.

Based in comparison with the convention prior art case where a series connection in a horizontal direction of two side-by-side thin film transistors is provided, the present invention provides two thin film transistors in a series connection; a channel region is formed on either side of a source-drain region connected in a bend section; the semiconductor thin film has a source-drain region formed and attached to each channel region; and a gate insulating film is formed above one side of that semiconductor thin film. Since this design has one gate electrode formed above the gate insulating film corresponding to the upper part of two channel regions of the semiconductor film, the horizontal layout space occupied by the two thin film transistors can be significantly reduced which makes it feasible to reduce the pixel pitch (pixel spacing) or to enlarge the pixel matrix open area ratio in connection with this.

While the present invention has been described with reference to the preferred embodiments, it is intended that the invention be not limited by any of the details of the description therein but includes all the embodiments which fall within the scope of the appended claims.

What is claimed is:

1. An active matrix panel comprising:
a plurality of scanning lines;
a plurality of data lines; and
a plurality of switching elements which are individually connected to the scanning lines and the data lines;
the switching elements respectively comprising:
a semiconductor thin film a semiconductor thin film••which includes:••
a common source-drain region having a bend portion with a channel region on one end and the other end further followed by a second source region of the channel region sequentially formed to one end of the common source-drain region and a second drain region of the channel region sequentially formed to the other end of the common source-drain which is connected to one of the data lines;

a gate insulating film arranged on a surface of the semiconductor thin film; and a gate electrode arranged in areas on the gate insulating film corresponding to the channel region upper part for the second source region and the second drain region which is connected to one of the scanning lines.

2. The active matrix panel according to claim 1, wherein the gate electrode includes a first electrode which traverses the channel region of second source region at a right angle and a second electrode which traverses the channel region of the second drain region at a right angle as well as the first electrode and the second gate electrode being sequentially formed.

3. The active matrix panel according to claim 1, wherein the gate electrode includes a bend portion where the first electrode and the second electrode join together.

4. The active matrix panel according to claim 1, wherein the panel comprises an insulating layer film formed between the gate electrode and the scanning lines which has a contact hole; and one of the scanning lines is connected to the gate electrode via the contact hole provided in the interlayer insulating film.

5. The active matrix panel according to claim 4, wherein the scanning lines formed on the insulating film and one of the first electrode and the second electrode of the gate electrode is arranged in a location which overlaps one of the scanning lines.

6. The active matrix panel according to claim 1, wherein the second drain region of the semiconductor thin film is arranged at a location which overlaps the data lines; and the second electrode which constitutes a segment of the data lines is formed above the second drain region.

7. The active matrix panel according to claim 1, wherein the scanning lines are arranged closer than the bend portion of the semiconductor thin-film in the second source side; and one of the second electrode of the gate electrode extends out to the opposite side with the second source region from the scanning lines.

8. The active matrix panel according to claim 7, wherein the panel comprises an insulating film formed between the gate electrode and the scanning lines which has a contact hole; and one of the scanning lines is connected to the gate electrode via the contact hole provided in the insulating film.

9. The active matrix panel according to claim 1, wherein the panel further comprises an overcoat film formed above the switching elements; and a pixel electrode is formed above the overcoat film.

10. The active matrix panel according to claim 1, wherein an auxiliary capacitative electrode is formed above the gate insulating film; and the data lines are arranged connected to the second drain region below the auxiliary capacitative electrode.

11. The active matrix panel according to claim 10, wherein the auxiliary capacitative electrode is formed wider than the data lines.

12. The active matrix panel according to claim 1, wherein an interlayer insulating film is formed above the gate electrodes and the gate insulating film; and an auxiliary capacitative electrode is formed above the interlayer insulating film.

13. The active matrix panel according to claim 12, wherein the data lines are formed below the auxiliary capacitative electrode.

14. The active matrix panel according to claim 13, wherein the auxiliary capacitative electrode is formed wider than the data lines.

15. The active matrix panel according to claim 12, wherein the respective scanning lines are connected to the gate electrode formed above the interlayer insulating film.

16. The active matrix panel according to claim 1, wherein the gate insulating film and the gate electrode are formed in this order below the semiconductor thin film; and an interlayer insulating film is formed above the semiconductor thin film.

17. The active matrix panel according to claim 16, wherein the auxiliary capacitative electrode is formed above the interlayer insulating film.

18. The active matrix panel according to claim 17, wherein the data lines are formed below the auxiliary capacitative electrode.

19. The active matrix panel according to claim 18, wherein the auxiliary capacitative electrode is formed wider than the data lines.

* * * * *